United States Patent
Nitta

(12) 
(10) Patent No.: US 6,582,998 B2
(45) Date of Patent: Jun. 24, 2003

(54) METHOD FOR FABRICATING NONVOLATILE SEMICONDUCTOR MEMORY DEVICE

(75) Inventor: Toshinari Nitta, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 180 days.

(21) Appl. No.: 09/834,643

(22) Filed: Apr. 16, 2001

(65) Prior Publication Data

US 2001/0034102 A1 Oct. 25, 2001

(30) Foreign Application Priority Data

Apr. 21, 2000 (JP) ......................... 2000-121412

(51) Int. Cl.[7] ................... H01L 21/8238; H01L 21/336; H01L 21/265; H01L 21/425; H01L 29/788
(52) U.S. Cl. ...................... 438/217; 438/211; 438/264; 438/308; 438/522; 438/530; 438/540; 438/556; 257/317; 257/321
(58) Field of Search ................. 438/211, 217, 438/264, 308, 522, 530, 540, 556, 593–594, 257, 305, 306, 514, 531, 302, 303; 257/317, 321, 314, 315

(56) References Cited

U.S. PATENT DOCUMENTS 5,525,529 A * 6/1996 Guldi ..................... 437/28

FOREIGN PATENT DOCUMENTS

JP          5-218072        8/1993

* cited by examiner

Primary Examiner—Olik Chaudhuri
Assistant Examiner—Neal Berezny
(74) Attorney, Agent, or Firm—McDermott, Will & Emery

(57) ABSTRACT

Ions of arsenic are selectively implanted at a high concentration into a substrate through a first passivation film of silicon dioxide to obtain a shallow junction, thereby forming a source region with a low resistivity and a first drain region. Then, after the first passivation film is removed, a second passivation film of silicon dioxide is deposited over the substrate as well as over a stacked cell electrode by a CVD process performed at a relatively low temperature. Thereafter, the substrate is annealed in a nitrogen ambient at such a temperature as activating the dopant introduced. In this manner, the dopant in source region and first drain region is activated.

8 Claims, 4 Drawing Sheets

METHOD FOR FABRICATING NONVOLATILE SEMICONDUCTOR MEMORY DEVICE

BACKGROUND OF THE INVENTION

The present invention relates to a method for fabricating a nonvolatile semiconductor memory device including a tunnel insulating film, and more particularly relates to a nonvolatile semiconductor memory device that can eliminate crystal defects from parts of a source or drain region under an end of a floating gate electrode.

A known nonvolatile semiconductor memory device and a method of fabricating the device will be described, with reference to the drawings.

FIGS. 2A through 2C are a typical method for fabricating a known stacked nonvolatile semiconductor memory device and illustrate cross-sectional structures corresponding to respective process steps.

First, as shown in FIG. 2A, a tunnel oxide film 103 is formed by thermal oxidation on a transistor region defined in a p-type silicon substrate 101 by an isolation film 102. Then, a staked cell electrode 107, consisting of floating gate electrode 104, capacitive insulating film 105, and control gate electrode 106, is formed on the tunnel oxide film 103. Thereafter, a silicon dioxide film 108 having a thickness of about 30 nm, for example, is deposited by a chemical vapor deposition (CVD) process over the substrate 101 as well as over the stacked cell electrode 107.

Next, as shown in FIG. 2B, arsenic ions are selectively implanted into the substrate 101 to form a source region 109 so that an edge of the source region 109 reaches a region under one end of the tunnel oxide film 103. Then, ions of boron, which is a p-type dopant of the same conductivity type as the dopant already introduced into the substrate 101, are selectively implanted into a part of the substrate 101 under the floating gate electrode 104 and in the vicinity of the edge of the source region 109 by a large-angle-tilt ion implantation technique. As a result, a threshold voltage setting region 110 for determining the threshold voltage of a memory cell is formed. Thereafter, the source region 109 is masked and arsenic ions are implanted into the substrate 101 to form a drain region 111 so that an edge of the drain region 111 reaches a region under the other end of the tunnel oxide film 103.

Then, as shown in FIG. 2C, the substrate 101 is annealed in an oxidizing ambient to activate the dopants implanted into the source/drain regions 109 and 111. The annealing process is performed in the oxidizing ambient to increase the thickness of the tunnel oxide film 103 at both ends thereof along the gate length of the floating gate electrode 104.

In this process, arsenic ions, which easily do damage on the silicon dioxide film 108, are implanted into the source region 109. In addition, the edge of the source region 109 reaches the region under the end of the tunnel oxide film 103. Furthermore, the large-angle-tilt ion implantation is performed to form the threshold voltage setting region 110. As a result, both ends of the tunnel oxide film 103 in the gate length direction are damaged by the implantation and have its quality degraded. In order to repair the damage, the tunnel oxide film 103 is thickened at both ends in the gate length direction.

A stacked nonvolatile semiconductor memory device stores data thereon by storing charge in the floating gate electrode 104. Thus, the device needs to exhibit a charge retention characteristic, i.e., charge should not leak into the substrate 101 so easily. The charge retention characteristic degrades partly because crystal defects are likely created in part of the source or drain region 109 or 111 under the tunnel oxide film 103.

When crystal defects are created in that part under the tunnel oxide film 103, the tunnel oxide film 103 is strained or a charge trap level is produced. As a result, charge is much more likely to leak into the substrate 101.

In the known method for fabricating the nonvolatile semiconductor memory device, ions are implanted for the source/drain regions 109 and 111 via the relatively thin silicon dioxide film 108 to protect the ends of the tunnel oxide film 103. Further, the silicon dioxide film 108 is coated with a masking resist for the ion implantation processes and cleaned to remove the masking resist. Thus, the thickness of the silicon dioxide film 108 changes because of implant-induced damage, contamination, and cleaning. If the dopants existing in the ion implanted regions are activated in such a state by annealing the substrate in an oxidizing ambient, oxidation-induced defects or doping-induced defects are likely created.

In a stacked nonvolatile semiconductor memory device, a source region 109 with a shallow junction and a low resistivity should be formed by implanting arsenic ions to reduce the width of a gate electrode while securing a sufficient operating current for a memory cell. For that purpose, the source region 109 is formed to have one edge reaching the region under the end of the tunnel oxide film 103 in the gate length direction. In addition, boron ions for controlling the threshold voltage of the memory cell are also implanted into the region under the tunnel oxide film 103 by the large-angle-tilt ion implantation. As a result, as shown in FIG. 2C, a crystal defect D1 is created under the tunnel oxide film 103, when the dopant existing in the source region 109 is activated.

Furthermore, to reduce the resistivity of the drain region 111, arsenic ions are implanted so that one edge of the drain region 111 reaches a region under the tunnel oxide film 103. As a result, a crystal defect D2 might be created in the drain region as in the source region 109.

SUMMARY OF THE INVENTION

It is therefore an object of the present invention to eliminate crystal defects from a part of a substrate under a tunnel oxide film in a nonvolatile semiconductor memory device.

In order to achieve this object, according to the present invention, a passivation film, which has been used for protecting a tunnel insulating film in ion implantation processes, is renewed, i.e., replaced with a new one before dopants introduced into the ion implanted regions are activated. And then the dopants introduced are activated in an inert gas ambient.

Specifically, an inventive method for fabricating a nonvolatile semiconductor memory device includes the steps of: a) forming a tunnel insulating film on a substrate and then selectively forming a floating gate electrode on the tunnel insulating film; b) forming a first passivation film on first and second regions of the substrate, the first and second regions being located below the floating gate electrode to horizontally sandwich the floating gate electrode therebetween; c) implanting ions of a first dopant into the substrate through the first passivation film with second region masked, thereby defining a doped region in the first region so that the doped region reaches a third region of the substrate, the third region being located around an end of the first region; d) removing the first passivation film and then forming a second passivation film on the first and second regions; and e) annealing the substrate, on which the second passivation film has been formed, in an inert gas ambient, thereby activating the first dopant in the doped region.

According to the inventive method, the first passivation film, which has been damaged during the ion implantation process, is replaced with the second passivation film having a good quality and covering the doped region. Then, the dopant in the doped region is activated by annealing in an inert gas ambient. Thus, neither oxidation-induced defects nor dopant-induced defects are created in a part of the doped region under an end of the floating gate electrode. As a result, a stress placed on the tunnel insulating film can be reduced and the charge retention characteristic of the device improves.

In one embodiment of the present invention, the step d) may comprise forming the second passivation film by performing a chemical vapor deposition process at such a temperature as not activating the dopant in the doped region. In such an embodiment, it is possible to prevent the dopant in the doped region from being activated before the second passivation film is formed.

In another embodiment, the method may further include the step f) of annealing the substrate in an oxidizing gas ambient, thereby thickening the tunnel insulating film at both ends thereof along the length of the floating gate electrode. The step f) may be performed after the step e) has been performed. In such an embodiment, it is possible to lessen the damage to be done on the tunnel insulating film by ion implantation at both ends thereof along the length of the floating gate electrode.

In still another embodiment, the doped region may be a source region, and the method may further include the step g) of implanting ions of a second dopant into the substrate through the first passivation film with the second region masked, thereby defining a threshold voltage setting region in the third region of the substrate. The step g) may be performed between the steps c) and d). In such an embodiment, the semiconductor memory device can operate as intended.

In yet another embodiment, the doped region may be a first drain region having a shallow junction, and the method may further include the step h) of implanting ions of a second dopant into the substrate through the first passivation film with the second region masked, thereby defining a second drain region that expands under the first drain region. The first and second dopants may be of the same conductivity type. The step h) may be performed between the steps c) and d). In such an embodiment, the second drain region is defined under the first drain region, and the drain region can have its junction breakdown strength increased.

DESCRIPTION OF THE PREFERRED EMBODIMENTS

An embodiment of the present invention will be described with reference to the drawings.

FIGS. 1A through 1H illustrate cross-sectional structures corresponding to respective process steps for fabricating a stacked nonvolatile semiconductor memory device according to an embodiment of the present invention.

Figure 1A:
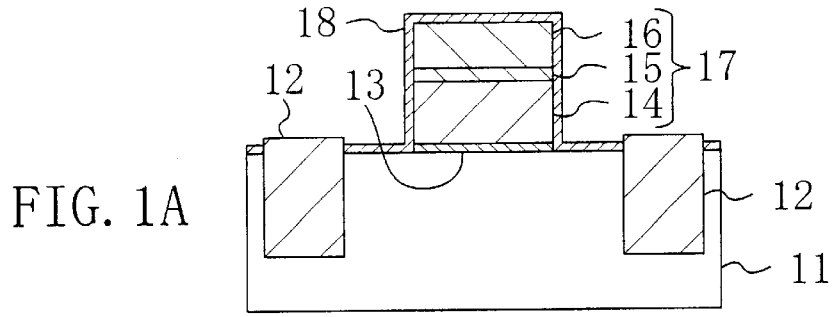
FIGS. 1A through 1H are cross-sectional views illustrating respective process steps for fabricating a stacked nonvolatile semiconductor memory device according to an embodiment of the present invention.

First, as shown in FIG. 1A, a trench isolation 12 is formed in a silicon substrate 11 and a p-well is formed by implanting ions into a transistor region of the substrate 11. Then, after a natural oxide is removed by wet etching from the transistor region, a tunnel oxide film 13 having a thickness of about 12 nm is formed by thermal oxidation. Thereafter, a stacked cell electrode 17, consisting of polysilicon floating gate electrode 14, capacitive insulating film 15 as a stack of silicon nitride and silicon oxide films, and polysilicon control gate electrode 16, is formed on the tunnel oxide film 13. Then, a first passivation film 18 of silicon dioxide is deposited to a thickness of about 30 nm by a CVD process over the substrate 11 as well as over the stacked cell electrode 17. The passivation film 18 is formed to lessen the damage to be done on the tunnel oxide film 13 at both ends thereof in the gate length direction when source/drain regions are formed by ion implantation afterward.

Figure 1B:
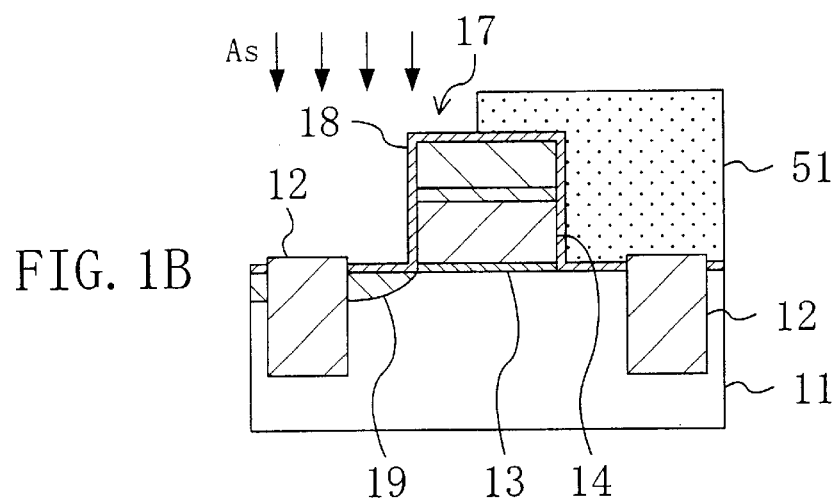

Next, as shown in FIG. 1B, a first resist pattern 51, having an opening over a region to be the source region in the substrate 11, is defined by a lithography process. Successively, using the first resist pattern 51 as a mask, ions of arsenic, which is an n-type dopant, are implanted by an ion implantation process at a high concentration into the substrate 11 to obtain a shallow junction. As a result, a source region 19 with a low resistivity is defined.

Figure 1C:
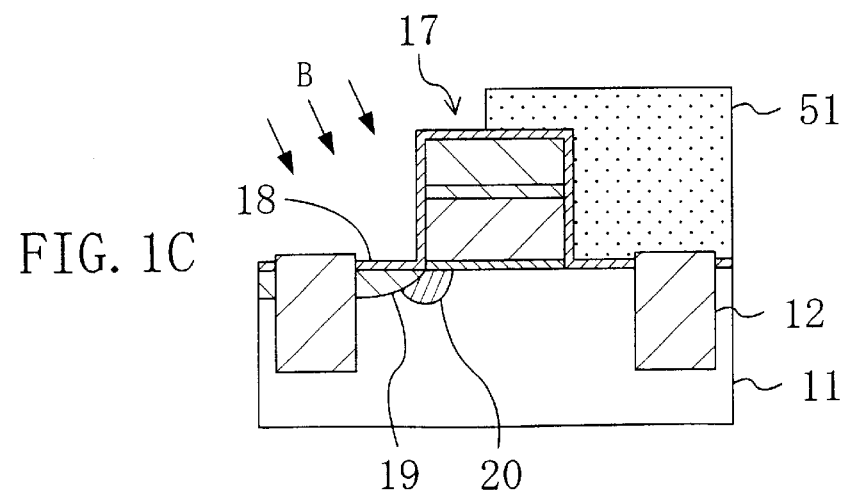

Then, as shown in FIG. 1C, ions of boron, which is a p-type dopant, are implanted into a part of the substrate 11 under the tunnel oxide film 13. In this case, a large-angle-tilt ion implantation process is performed to form an angle of about 30 degrees with a side of the floating gate electrode 14 in the gate length direction. In this manner, a threshold voltage setting region 20 for determining the threshold voltage of a memory cell is defined.

Figure 1D:
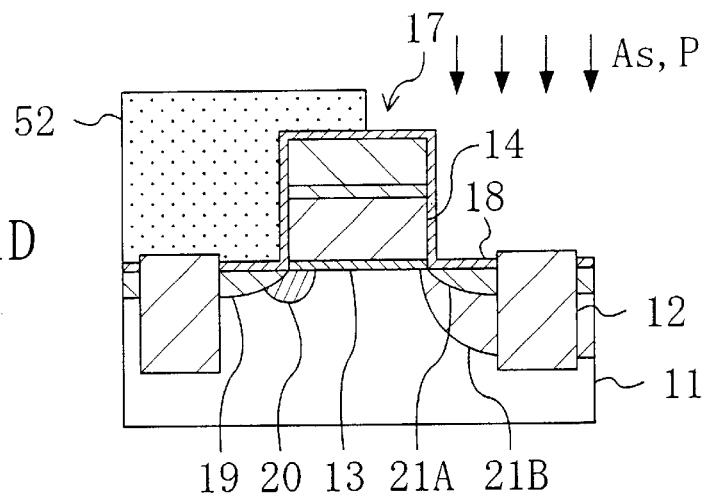

Subsequently, as shown in FIG. 1D, after the first resist pattern 51 has been cleaned away, a second resist pattern 52 having an opening over a region to be the drain region in the substrate 11 is defined by a lithography process. Successively, using the second resist pattern 52 as a mask, ions of arsenic, which is an n-type dopant, are implanted by an ion implantation process at a high concentration into the substrate 11 to obtain a shallow junction. As a result, a first drain region 21A with a low resistivity is formed. Next, using the second resist pattern 52 as a mask, ions of phosphorus, which is an n-type dopant, are implanted into the substrate 11 so that the dopant introduced diffuses to reach a region of the substrate 11 under the first drain region 21A. In this manner, a second drain region 21B having a high junction breakdown strength is formed. Then, the second resist pattern 52 is cleaned off.

In this case, one edge of each arsenic ion implanted layer formed for the source region 19 or first drain region 21A, reaches a region under a corresponding end of the tunnel oxide film 13. This is because the first passivation film 18 deposited over the substrate 11 is relatively thin, i.e., about 30 nm. Further, the surface of the first passivation film 18 is roughened due to the damage caused by the implantation process (arsenic ion implantation, in particular) for the source region 19 and the first drain region 21A. Furthermore, the first passivation film 18 decreases its thickness or is contaminated when the first and second resist patterns 51 and 52 are defined for the source region 19 and first drain region 21A or when those patterns are cleaned away. As a result, the first passivation film 18 has its quality extremely degraded.

Figure 1E:
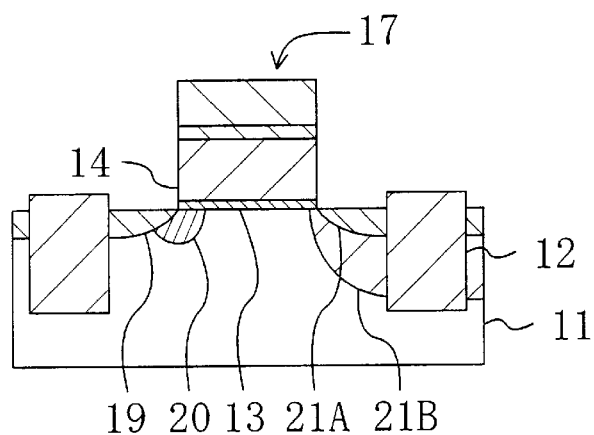

To avoid the degradation, according to this embodiment, the first passivation film 18 is removed, as shown in FIG. 1E, by wet etching using diluted hydrofluoric acid in which hydrofluoric acid solution is mixed with ammonia water at a ratio of 1:5. The wet etching process is performed so that the etch selectivity of the first passivation film 18 to tunnel oxide film 13 is 3:1, i.e., the etch rate of the first passivation film 18 is much higher than that of the tunnel oxide film 13. Thus, it is possible to prevent the tunnel oxide film 13 from being etched excessively when the first passivation film 18 of silicon dioxide is wet-etched. Alternatively, parts of the first passivation film 18 over the source region 19 and first drain region 21A may be removed by an anisotropic dry etching process.

Figure 1F:
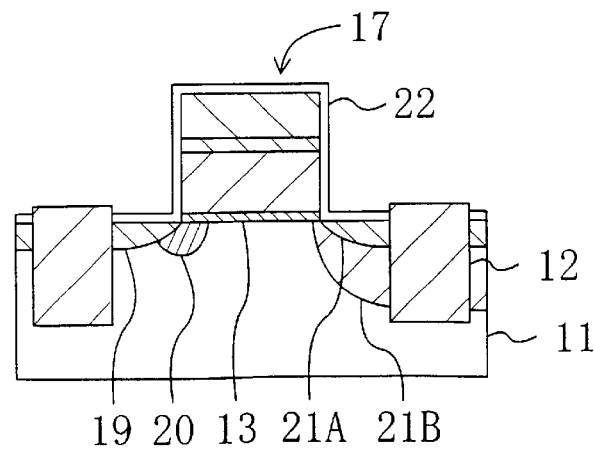

Next, as shown in FIG. 1F, a CVD process is performed at a relatively low deposition temperature of about 480° C., using, e.g., tetraethoxy silane, as a source gas for a silicon dioxide film. In this manner, a second passivation film 22 is deposited to a thickness of about 30 nm over the substrate 11 as well as over the stacked cell 17. It is to prevent the dopants contained in the source region 19 and first and second drain regions 21A and 21B from being unintentionally activated due to the heat generated by the thermal CVD process that the second passivation film 22 is deposited at as low as about 480° C. The second passivation film 22 may also be deposited by photo CVD process utilizing a photo-excitation reaction, laser ablation, or jet vapor phase epitaxy, for example.

Figure 1G:
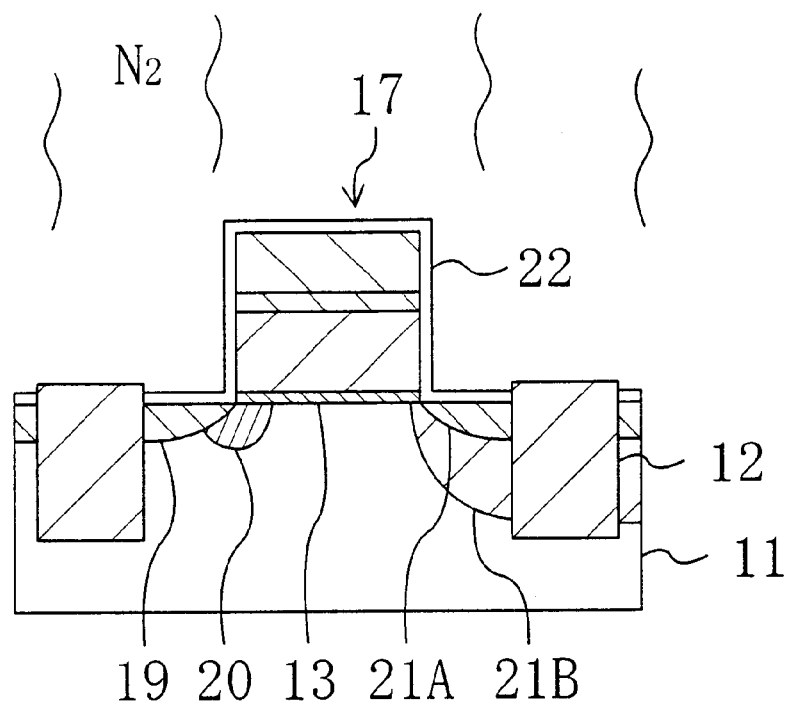

Then, as shown in FIG. 1G, the substrate 11 is annealed for about one hour in a nitrogen ambient at a temperature of, e.g., about 900° C., which is high enough to activate the dopants contained in the ion implanted regions. In this manner, the dopants contained in the source region 19 and first and second drain regions 21A and 21B are activated by solid phase epitaxy. In this case, the annealing is performed in the nitrogen ambient, and no oxidation-induced defects are created. Further, since the second passivation film 22 without any damage is formed over the source and first drain regions 19 and 21A, no doping-induced defects are also created.

In this case, if the substrate 11 is annealed in a nitrogen ambient without depositing the second passivation film 22, or with the surface of the source region 19 and first drain region 21A exposed, then a what is called "outdiffusion" occurs. In other words, implanted arsenic ions and so on diffuse out of the ion implanted regions. As a result, the resistivity of the source region 19 and first drain region 21A changes. Accordingly, to prevent the outdiffusion, the surface of the source and first drain regions 19 and 21A is preferably covered with the second passivation film 22.

Instead of nitrogen, argon (Ar) may be used for an alternative inert gas.

Figure 1H:
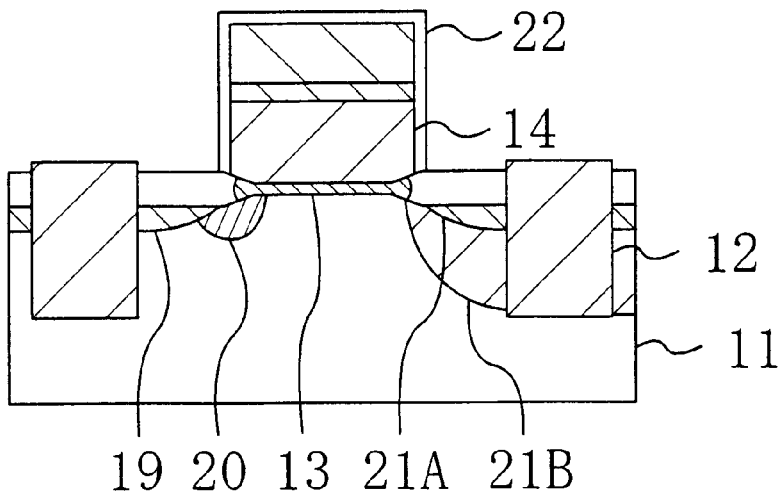
Figure 2A:
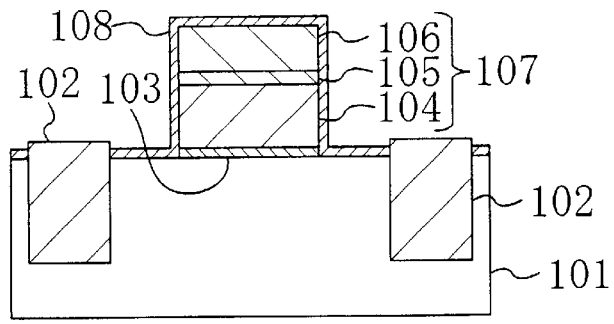
FIGS. 2A through 2C are cross-sectional views illustrating respective process steps for fabricating a known stacked nonvolatile semiconductor memory device.
Figure 2B:
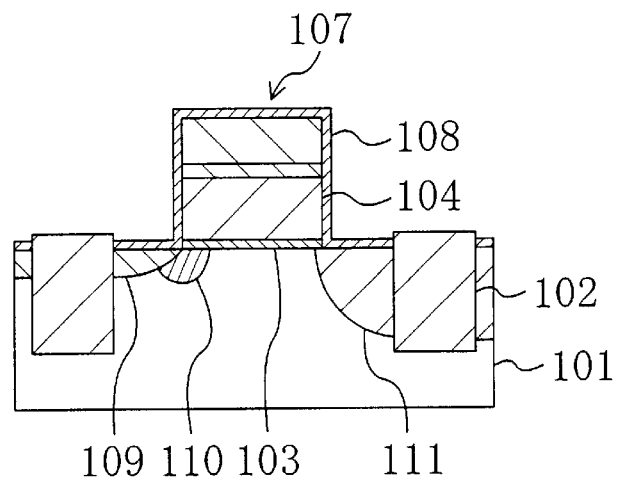
Figure 2C:
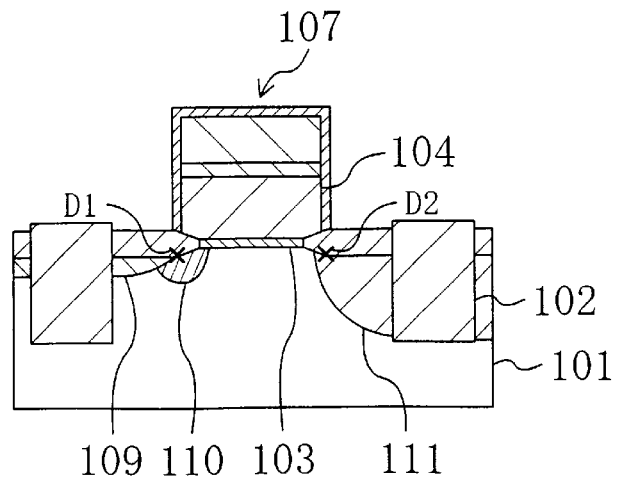

Then, as shown in FIG. 1H, the substrate 11, in which the dopants implanted have been activated, is oxidized in an oxidizing ambient at a temperature of about 900° C. for about 30 minutes, thereby thickening the tunnel oxide film 13 at both ends thereof in the gate length direction. As a result, it is possible to repair the ion implant damage done on the tunnel oxide film 13 at both ends thereof in the gate direction.

As described above, according to this embodiment, the first passivation film 18, which has its quality degraded by ion implantation, is removed before the dopants in the regions to be source/drain regions in the substrate 11 are activated. Instead, the second passivation film 22 having good quality is formed. Thus, no doping-induced defects are created in any of the source region 19 and first and second drain regions 21A and 21B. Further, the dopants introduced are activated in an inert gas ambient, and no oxidation-induced defects are also created.

Accordingly, the tunnel oxide film 13 is not strained and has no charge trap levels resulting from crystal defects at the ends thereof in the gate length direction. Thus, a stacked nonvolatile semiconductor memory device, exhibiting an excellent charge retention characteristic, is realized.

Further, the method for fabricating a nonvolatile semiconductor memory device according to this embodiment can prevent crystal defects from being created in respective parts of source/drain regions under a tunnel oxide film. In addition, it is also possible to eliminate crystal defects from the entire source/drain regions. As a result, junction leakage current is reduced in the source/drain regions.

Furthermore, after the source/drain regions have been defined by ion implantation, the second passivation film 22 is newly deposited over the substrate. Thus, the surface of the second passivation film 22 is flat and is not damaged. Accordingly no outdiffusion will occur in the annealing process performed in a nitrogen ambient. As a result, the memory cell characteristic is stabilized.

What is claimed is:

1. A method for fabricating a nonvolatile semiconductor memory device, the method comprising the steps of:
   a) forming a tunnel insulating film on a substrate and then selectively forming a floating gate electrode on the tunnel insulating film;
   b) forming a first passivation film on first and second regions of the substrate, the first and second regions being located below the floating gate electrode to horizontally sandwich the floating gate electrode therebetween;
   c) implanting ions of a first dopant into the substrate through the first passivation film with second region masked, thereby defining a doped region in the first region so that the doped region reaches a third region of the substrate, the third region being located around an end of the first region;
   d) removing the first passivation film and then forming a second passivation film on the first and second regions, said first dopant in the doped region not being actuated during formation of said second passivation film; and
   e) annealing the substrate, on which the second passivation film has been formed, in an inert gas ambient, thereby activating the first dopant in the doped region.

2. The method of claim 1, wherein the step d) comprises forming the second passivation film by performing a chemical vapor deposition process at a temperature such that said first dopant is not activated during formation of said second passivation film.

3. The method of claim 1, further comprising the step f) of annealing the substrate in an oxidizing gas ambient, thereby thickening the tunnel insulating film at both ends thereof along the length of the floating gate electrode, the step f) being performed after the step e) has been performed.

4. The method of claim 1, wherein the doped region is a source region, and
   wherein the method further comprises the step g) of implanting ions of a second dopant into the substrate through the first passivation film with the second region masked, thereby defining a threshold voltage setting region in the third region of the substrate, the step g) being performed between the steps c) and d).

5. The method of claim 1, wherein the doped region is a first drain region having a shallow junction, and wherein the method further comprises the step h) of implanting ions of a second dopant into the substrate through the first passivation film with the second region masked, thereby defining a second drain region that expands under the first drain region, the first and second dopants being of the same conductivity type, the step h) being performed between the steps c) and d).

6. A method for fabricating a nonvolatile semiconductor memory device, the method comprising the steps of:

a) forming a tunnel insulating film on a substrate and then selectively forming a floating gate electrode on the tunnel insulating film;

b) forming a first passivation film on the substrate, at least covering a side of an edge portion of the tunnel insulating film under the floating gate electrode;

c) implanting ions of a first dopant into the substrate through the first passivation film, thereby defining a first doped region in the substrate so that an edge portion of the first doped region reaches a region under the edge portion of the tunnel insulating film;

d) removing the first passivation film and then forming a second passivation film on the substrate, at least covering a tunnel insulating film edge under the floating gate electrode, said first dopant not being actuated during formation of said second passivation film;

e) annealing the substrate, on which the second passivation film has been formed, thereby activating the first dopant in the first doped region.

7. The method of claim 6, wherein the step e) is performed in an inert gas ambient.

8. The method of claim 6, wherein the method further comprises the step f) of implanting ions of a second dopant into the substrate through the first passivation film, thereby defining a second doped region being located around the edge portion of the first doped region, the step f) being performed between the steps c) and d).

* * * * *